United States Patent [19]

Messick

[11] 4,252,580
[45] Feb. 24, 1981

[54] METHOD OF PRODUCING A MICROWAVE INP/SiO₂ INSULATED GATE FIELD EFFECT TRANSISTOR

[76] Inventor: Louis J. Messick, 6312 Lake Alturas Ave., San Diego, Calif. 92119

[21] Appl. No.: 40,840

[22] Filed: May 21, 1979

Related U.S. Application Data

[62] Division of Ser. No. 846,070, Oct. 27, 1977, Pat. No. 4,161,739.

[51] Int. Cl.³ .................... H01L 21/208; H01L 21/31
[52] U.S. Cl. ....................................... 148/175; 29/571; 148/171; 148/173; 148/174; 357/23; 357/58; 357/61; 427/87; 427/93; 427/95
[58] Field of Search ................ 148/174, 175, 171–173; 427/87, 93, 95; 29/571; 357/23, 58, 61

[56] References Cited

U.S. PATENT DOCUMENTS

| | | | |
|---|---|---|---|
| 3,472,689 | 10/1969 | Scott | 427/95 |
| 3,607,378 | 9/1971 | Ruggiero | 427/95 |
| 3,700,978 | 10/1972 | North et al. | 29/571 X |
| 3,821,777 | 6/1974 | James | 357/61 X |
| 3,856,588 | 12/1974 | Hashimoto et al. | 427/95 X |

OTHER PUBLICATIONS

DeWitt; D., "Field Effect Transistor", IBM Tech. Discl. Bull., vol. 9, No. 1, Jun. 1966, p. 102.
Antypas et al., "Growth and Characterization of InP . . .", J. Electrochem. Sol., vol. 120, No. 11, Nov. 1973, pp. 1574–1577.
Barrera et al., "InP Schottky-Gate Field-Effect Transistors", IEEE Trans. on Electron Device, vol. ED-22, No. 11, Nov. 1975, pp. 1023–1030.
Fukuta et al., "Power GaAs Mesfet . . . Breakdown Voltage", IEEE Trans. on Microwave Theory & Tech., vol. MTT-24, No. 6, Jun. 1976, pp. 312–317.

*Primary Examiner*—L. Dewayne Rutledge
*Assistant Examiner*—W. G. Saba
*Attorney, Agent, or Firm*—Richard S. Sciascia; Ervin F. Johnston; Thomas M. Phillips

[57] ABSTRACT

An InP/SiO₂ insulated gate field effect transistor which exhibits power gain at microwave frequencies is manufactured by using an n-type epitaxial semiconducting InP film on a semi-insulating InP substrate and depositing a pyrolytic silicon dioxide insulating film on the conducting InP film to form the gate insulator.

8 Claims, 5 Drawing Figures

METHOD OF PRODUCING A MICROWAVE INP/SiO₂ INSULATED GATE FIELD EFFECT TRANSISTOR

This is a division of application Ser. No. 846,070, filed Oct. 27, 1977 now U.S. Pat. No. 4,161,739.

BACKGROUND OF THE INVENTION

There is a growing need for the processing of vast amounts of data in very short periods of time. This requires higher and higher speed integrated logic circuitry. The silicon insulated gate field effect transistor, which plays an important role in these integrated circuits, will only operate up to about 4 GHz due to the low electron mobility in silicon. For this reason there is a need for the development of an insulated gate field effect transistor fabricated of a high mobility compound such as GaAs or InP.

Attempts to solve this problem in the past have not met with success, for example, Becke, et al (Solid State Electronics 8, 813 (1965)) tried silicon dioxide as a gate insulator for gallium arsenide and found it to be unsuitable due to a high interface state density between the semiconductor and the insulator which grossly degrades the device performance. Also gallium arsenide devices using silicon nitride as the gate insulator have been tried by Becke, et al, (Electronics 40, 83 (1967)). These devices operated only to about 400 MHz.

SUMMARY OF THE INVENTION

In accordance with the teachings of this invention, there is provided a novel insulated gate field effect transistor having a gate insulating film deposited on a high mobility material.

An n-type semiconducting InP epitaxial film is disposed on a semi-insulating InP substrate. A layer of pyrolytic $SiO_2$ is disposed on the semiconducting film. The $SiO_2$ film is removed from two areas to which is applied source and drain metal contacts to the InP epitaxial film. The strip of $SiO_2$ film remaining between the two areas is the gate insulator on which is deposited a gate metal film.

OBJECTS OF THE INVENTION

An object of the present invention is the provision of an insulated gate field effect transistor which will operate at frequencies above 10 GHz.

Another object of this invention is the provision of an $InP/SiO_2$ insulated gate field effect transistor.

Another object of the invention is the provision of a process for the formation of an $InP/SiO_2$ insulated gate field effect transistor by deposing an n-type semiconducting InP film on a semi-insulating InP substrate and then depositing a silicon dioxide insulating film on said conducting InP film to form the gate insulator.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
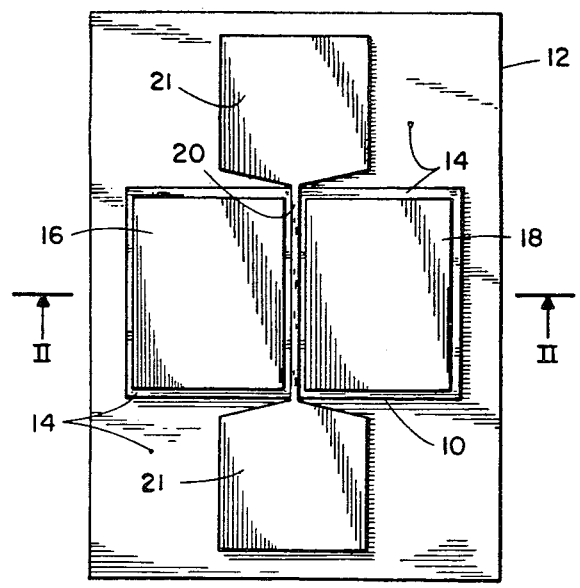
FIG. 1 is a top view of the device embodying the invention.
Figure 2:
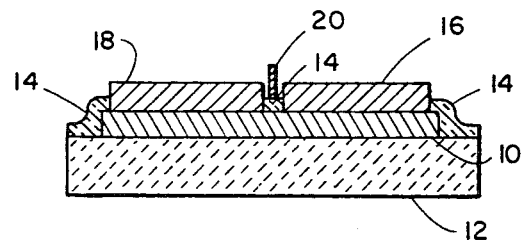
FIG. 2 is a section taken along the lines II—II of FIG. 1.

Referring now to the drawings wherein there is shown in FIGS. 1 and 2 an insulated gate field effect transistor made in accordance with the teachings of the invention. As drawn, the drawings are not necessarily to scale and in some cases are distorted for purposes of clarity.

The n-type epilayers used in making the present invention were prepared by liquid phase epitaxy (LPE) on (100) oriented Fe and Cr doped semi-insulating InP substrates which were chemo-mechanically polished in 0.5% Br/methanol. Immediately prior to placing them in the LPE reactor the substrates were cleaned in a 1-minute bath of 45% KOH solution heated to just below its boiling point, followed by a deionized water rinse, a methanol rinse, a 15-second etch in 0.5% Br/methanol with ultrasonic agitation, a methanol rinse, and nitrogen blow dry. Four grams of 69 indium were saturated at 680° C. from 770 ppm $PH_3$ in 400 ml/min purified $H_2$ over a period of about 4 hours. A flow of ~30 ppm $PH_3$ in 350 ml/min $H_2$ was maintained during growth to inhibit thermal degration of the substrate surface. The solution was cooled 7° C. below the liquidus with no solid present and was then brought in contact with the substrate for a 30-second growth time.

Layers grown in this manner are estimated to have a thickness between 0.3 and 0.8 $\mu$m. Van der Pauw type galvanomagnetic measurements made at 300° K. gave net free carrier densities between 2.6 and $7 \times 10^{16}$ cm$^{-3}$ and corresponding mobilities $\mu \approx 2800$ cm$^2$/V-sec at 300 K. At 77 K the mobility rose to ~6800 cm$^2$/V-sec.

Once the epitaxial film 10 has been deposed on the semi-insulating substrate 12, fabrication of the transistor proceded by the use of photolithography and liftoff. The gate insulator 14 is formed in the manner described by L. Messick, J. Appl. Phys. 47 4949 (1976) as modified as hereinafter described. As described in the above referenced article chemical vapor deposition of the dielectric layers of pyrolytic $SiO_2$ is accomplished inside a water-cooled quartz reactor 2 inches in diameter and 15 inches long through which passes a mixture of $N_2$ (non-reactive carrier gas), $O_2$ and $SiH_4$ (silane) gasses. The gasses pass through separate flow meters to a stainless-steel mixing chamber (which can be maintained at a pressure other than that of the reactor by use of a valve) and then through a quartz wool filter into the reactor from which they exhaust at atmosphere pressure. The substrate, located in the gas stream, is supported and heated by a carbon block containing a wirewound heating element. The temperature of the block is monitored by a quartz sheathed Chromel-Alumel thermocouple located between the heating element and the substrate. In order to avoid thermal decomposition of the InP substrates, the films were formed near the minimum temperature for high-quality film deposition, of approximately 300° C. With the mixing chamber pressure maintained at 12 lb/in$^2$, the gas mixture, 99.46% $N_2$, 0.50% $O_2$ and 0.04% $SiH_4$ was passed with a velocity of 3 centimeters per second at atmospheric pressure over the sample surface which was then heated to 314° C. resulting in a SiO$_2$ deposition rate ~30 A/min. The temperature measurement was calibrated using the melting points of tin and lead. It should be understood that 314° C. is included in the expression, approximately 300° C. Deposition was allowed to continue until the sample appeared light blue at which time the insulator thickness was approximately 1200 A. These films typically have resistivities >10$^{15}$Ω cm, breakdown field strengths >5×10$^6$ V/cm, and on InP, interface state densities ~2×10$^{11}$ cm$^{-2}$ eV$^{-1}$. During device processing the SiO$_2$ was removed from the source and drain areas with buffered HF. There is shown in FIGS. 1 and 2 an InP/SiO$_2$ insulated gate field effect transistor which is fabricated by photolithography and liftoff. An n-type mesa of InP semiconducting film 10 is formed on substrate 12. A film of SiO$_2$ 14 is then deposited over the substrate 12 and mesa 10. By etching away the SiO$_2$ from two areas on the mesa 10, two areas are provided where source contact 16 and drain contact 18 are then deposited by vacuum evaporation. Contacts 16 and 18 are separated from each other by the strip of SiO$_2$ 14 (FIG. 2). A gate metal electrode 20 is then deposited on the SiO$_2$ strip and on the SiO$_2$ deposited on substrate 12 to provide gate pads 21 to which leads may be bonded.

The n-type epitaxial semiconducting InP film should have a resistivity greater than 10$^4$ ohm cm while the InP semi-insulating substrate should be of n-type with a carrier concentration in the range between 10$^{16}$/cm$^3$ and several times 10$^{17}$/cm$^3$.

Gate electrode 20 is vacuum evaporated Al 4 μm long and 260 μm wide with source and drain contacts 16 and 18, respectively, being made of alloyed Au-Ge/Ni; the drain-source spacing is 8 μm.

Figure 3:
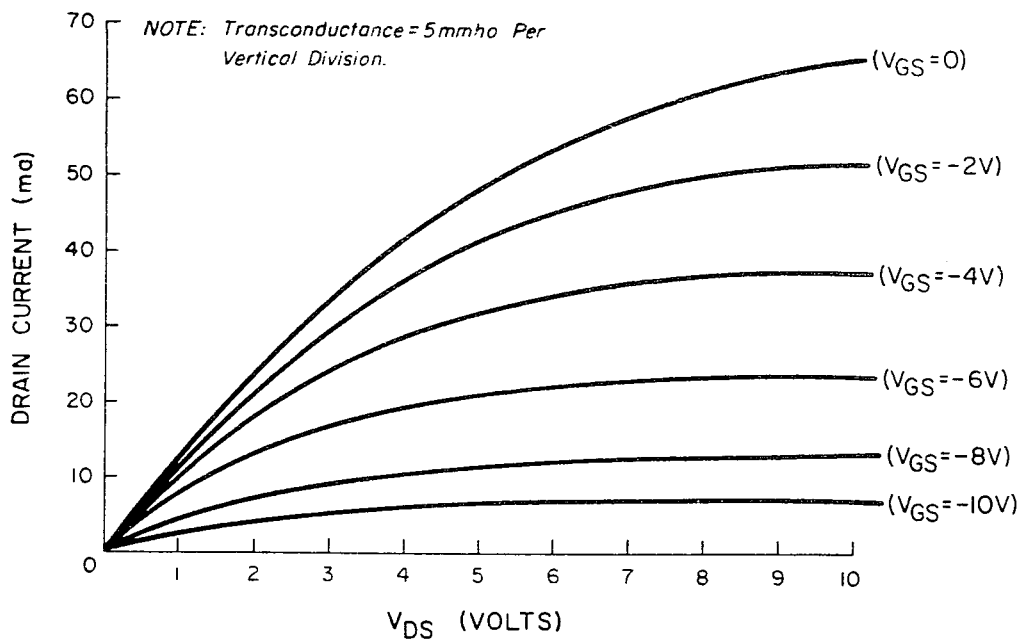
FIG. 3 is a graph of the operating characteristics of a particular device with the geometry of FIG. 1.

FIG. 3 shows the drain current versus drain voltage characteristics of an InP/SiO$_2$ MISFET indicating a maximum transconductance for this device of 7 mmho at the 120 Hz curve tracer sweep frequency. The field effect transistors made in accordance with the invention were bonded into microwave packages and evaluated as to their power gains using the setup shown schematically in FIG. 4. The signal generators 22 were of the HP 612A, 616A and 8614A types. The power meter 24 is a HP 431C with a 478A transistor mount. All interconnections between the signal generator, triple stub tuners 26 and bias Ts 28 were coaxial.

At a fixed frequency, with the power meter 24 connected directly to its output, the signal generator output attenuator was adjusted to yield a power meter reading of −10 dBm. Thereafter no settings on the signal generator were changed. Following this, with the configuration of FIG. 4 but with the packaged field effect transistor 30 replaced by a straight through coaxial connector and the bias voltages turned to zero, the triple stub tuners 26 were adjusted to minimize system mixmatch as indicated by a maximum reading on the power meter. This reading ranged between −10.5 dBm and −10.7 dBm depending on the frequency and on which signal generator was used and provides an estimate of the power loss in the measurement system excluding the packaged field effect transistor 30.

Figure 4:
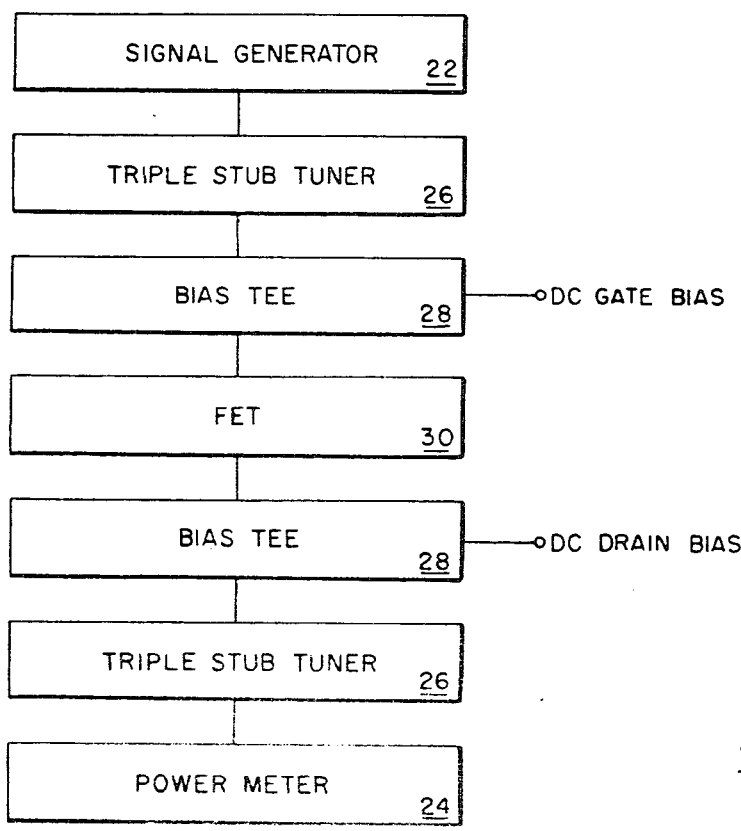
FIG. 4 shows in block diagram the test setup for evaluating the device.

Finally, the output power of the transistor 30 was measured as shown in FIG. 4 with the entire procedure being repeated at each frequency. As a check for saturation effects measurements were also made at an input level of −20 dBm. No saturation was observed.

Figure 5:
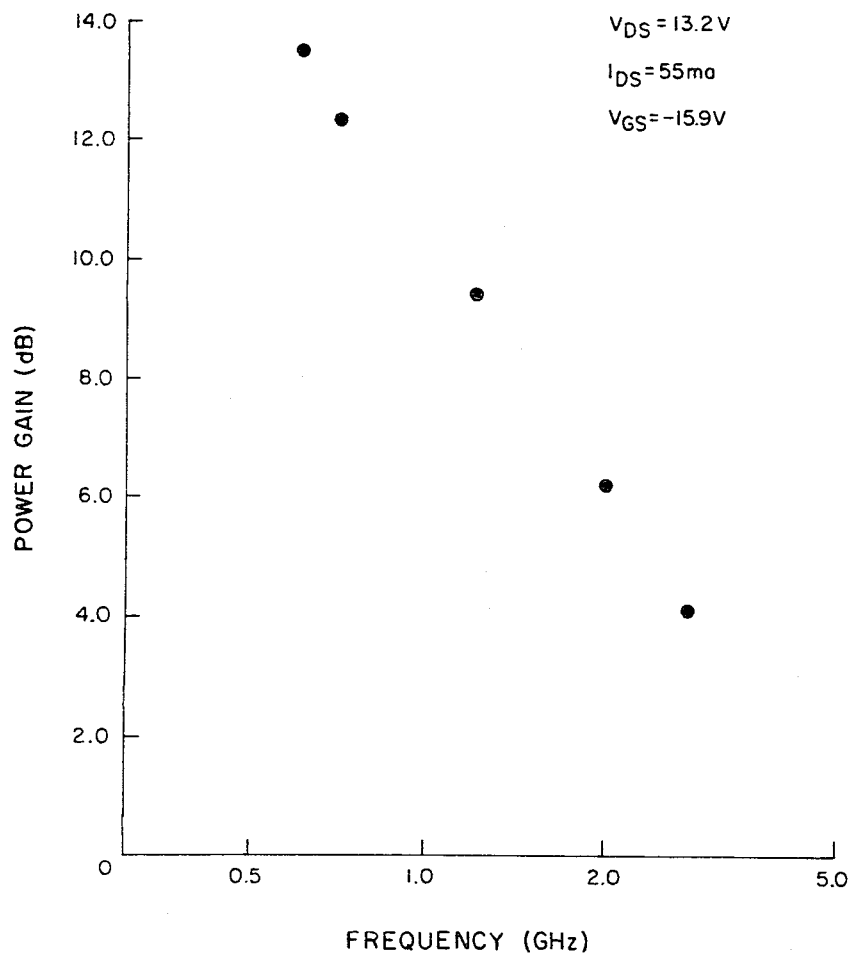
FIG. 5 is a graph showing the power gain of the device of FIG. 3 as a function of frequency.

The results of these measurements made on the field effect transistor made in accordance with the present invention are shown in FIG. 5. The power gain increased as the gate-to-source bias voltage was made more negative.

It is of interest that the extrapolated cutoff frequency of 6 GHz for this 4 μm gate length device is close to 8 GHz, the frequency which would be predicted from the results of Barrera and Archer (IEEE Trans. Electron Devices, ED-22, 1023 (1975)) for a similar Schottky gate structure. Since the cutoff frequency of a field effect transistor is inversely proportional to its gate length it is likely that with state of the art gate lengths the InP/SiO$_2$ insulated gate field effect transistor will perform at frequencies of several tens of GHz or higher.

Obviously many other modifications and variations of the present invention are possible in the light of the above teachings. It is therefore to be understood that within the scope of the appended claims the invention may be practiced otherwise than as specifically described.

What is claimed is:

1. In a method for producing an insulated gate field effect transistor, the steps of:
    selecting a semi-insulating indium phosphide substrate;
    depositing a film of n-type semiconducting indium phosphide on said substrate;
    disposing a source contact and a drain contact spread apart on said semiconducting film;
    depositing a layer of silicon dioxide over said semiconducting film between said source and drain contacts; and
    disposing a gate electrode on said layer of silicon dioxide.

2. The method of claim 1 wherein said InP material is an epitaxial film.

3. The method of claim 2 wherein said InP material is a mesa of epitaxial film.

4. The method of claim 3 wherein said mesa is separated into two distinct regions with said gate electrode intermediate said regions, one of said regions having said source contact disposed thereon and the other of said regions having said drain contact disposed thereon.

5. The method of making an insulated gate field effect transistor including the steps of:
    placing an indium phosphide sample consisting of an indium phosphide n-type semiconducting film deposed on a semi-insulating indium phosphide substrate, in a reaction zone;
    introducing a vaporous mixture of nitrogen, oxygen and silane (SiH$_4$) into said reaction zone;
    heating said indium phosphide sample to a temperature sufficient to cause the formation of a vitreous SiO$_2$ film on said semiconducting film without producing interfacial properties unsuitable for the fabrication of field effect transistors;
    maintaining said temperature for a period of time sufficient to deposit an SiO$_2$ film having a thickness suitable as a gate insulating film on the surface of said semiconducting film.

6. The method of claim 5 wherein said semiconducting film has a resistivity greater than 10$^4$ ohm cm and said substrate is n-type InP with a carrier concentration in the range between 10$^{16}$/cm$^3$ and several times 10$^{17}$/cm$^3$.

7. The method of claim 5 wherein said vaporous mixture consists of substantially 99.46% N$_2$, 0.50% O$_2$ and 0.04% SiH$_4$.

8. In a method for producing an insulated gate field effect transistor, the steps of:

selecting a semi-insulating indium phosphide substrate;

depositing a film of n-type semiconducting indium phosphide on said substrate;

disposing a source contact and a drain contact spread apart on said semiconducting film;

depositing a layer of insulating material over said semiconducting film between said source and drain contacts; and disposing a gate electrode on said layer of insulating material.

* * * * *